(12) United States Patent
Trouilloud

(10) Patent No.: US 7,768,809 B2
(45) Date of Patent: Aug. 3, 2010

(54) WALL NUCLEATION PROPAGATION FOR RACETRACK MEMORY

(75) Inventor: Philip Louis Trouilloud, Norwood, NJ (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 12/244,045

(22) Filed: Oct. 2, 2008

(65) Prior Publication Data

US 2010/0085793 A1   Apr. 8, 2010

(51) Int. Cl.
  *G11C 19/00* (2006.01)
(52) U.S. Cl. .................. 365/81; 365/158; 365/171; 365/173
(58) Field of Classification Search .......... 365/48, 365/55, 62, 66, 74, 78, 80–93, 100, 130, 365/131, 148, 158, 171–173, 225.5, 243.5; 216/22; 257/421, E21.665; 483/3; 977/933–935
See application file for complete search history.

(56) References Cited

U.S. PATENT DOCUMENTS

| 6,834,005 | B1 | 12/2004 | Parkin |
| 2007/0262301 | A1* | 11/2007 | Cowburn et al. ............. 257/40 |
| 2008/0080234 | A1* | 4/2008 | Iwata et al. ................. 365/171 |
| 2008/0165576 | A1 | 7/2008 | Deligianni et al. |
| 2008/0166584 | A1 | 7/2008 | Deligianni et al. |
| 2008/0166874 | A1 | 7/2008 | Deligianni et al. |

* cited by examiner

*Primary Examiner*—Richard Elms
*Assistant Examiner*—Harry W Byrne
(74) *Attorney, Agent, or Firm*—Ryan, Mason & Lewis, LLP

(57) ABSTRACT

A shift register is provided, the shift register comprising at least one track including a storage region. The storage region comprises a plurality of magnetic domains for storing data. A given first one of the plurality of magnetic domains is adjacent to a given second one of the plurality of magnetic domains. The given first one of the plurality of magnetic domains and the given second one of the plurality of magnetic domains are arranged in a linear configuration. Further, the given first one of the plurality of magnetic domains and the given second one of the plurality of magnetic domains are separated from one another by at least one layer of non-magnetic material. The at least one layer of non-magnetic material preventing a propagation of a nucleated wall from traveling between the given first one of the plurality of magnetic domains and the given second one of the plurality of magnetic domains. The shift register is configured such that an electric current applied to the track is operative to shift data stored within at least one of the plurality of magnetic domains of the storage region, along the track, in a direction of the electric current. The data stored within the at least one of the plurality of magnetic domains is shifted as a function of the direction of the electric current.

15 Claims, 4 Drawing Sheets

THREE-DIMENSIONAL VIEW

THREE-DIMENSIONAL VIEW

CROSS-SECTIONAL VIEW

CURRENT PULSE 610

WALL NUCLEATION PROPAGATION FOR RACETRACK MEMORY

FIELD OF THE INVENTION

The present invention relates generally to electrical and electronic devices and systems, and more particularly, to semiconductor memory.

BACKGROUND OF THE INVENTION

New shiftable magnetic shift registers, more commonly known as racetrack memory, may be a solution for our growing need for faster and cheaper high capacity memory. Racetrack memory could become a viable alternative to current forms of data storage. For instance, mechanical disk drives provide high capacity storage at a low cost, but mechanical drives are fundamentally unreliable due to their many moving parts. Solid state drives provide relatively reliable storage, but at a high cost for low capacity. Racetrack memory should allow high capacity storage at a fraction of the cost of solid state memory. However, additional improvements would make racetrack memory a more cost-effective and reliable alternative.

The general design of racetrack memory has been documented. See, e.g., U.S. Pat. No. 6,834,005, issued Dec. 21, 2004, entitled, "Shiftable Magnetic Shift Register and Method of Using the Same," the disclosure of which is incorporated herein by reference. The basic mechanism for racetrack memory involves the use of a fine track made of magnetic material. The track may be magnetized in small sections, or domains, in one direction (e.g., representing a bit value of "0") or in the opposite direction (e.g., representing a bit value of "1"). An electric current is applied to the track to rapidly move or shift the domains along the track. As the domains move along the track, a reading device or "head," situated at a fixed location beside the track, can read the domains "bit-by-bit." In the alternative, a writing device or "head," situated at a fixed location beside the track, can change the bit value of a given domain by magnetically altering the direction of the magnetic moment stored within the given domain.

The direction and speed of movement of the domains along the magnetic track is controlled by both the magnitude and direction of the electric current. Further, the amount of time during which the electric current is applied also affects the movement of the domains along the track. Ideally, one controlled pulse of electric current should move the domains one domain distance or increment along the track. However, one issue with conventional racetrack memory designs is maintaining consistent domain movements. Even if the applied electric current is consistent, the domains may shift at different rates and/or distances at each electric pulse or shift cycle. Further, even if no current is applied, the domains may move in the rest state, modifying the stored data and resulting in erroneous data reads.

In order to address inconsistent and/or spontaneous domain movements, experts have proposed "pinning" the locations of the domains. This technique involves physically notching the magnetic track at fixed intervals to clearly define the borders of the domains. To a limited extent, pinning does yield more consistent domain movements; however, pinning does not fully address spontaneous drifting of the domains along the magnetic track.

SUMMARY OF THE INVENTION

Illustrative embodiments of the present invention beneficially address the above-noted problems regarding inconsistent and/or spontaneous domain movements in a shift register by promoting controlled wall nucleation, wall propagation, and wall annihilation within an individual magnetic domain during a shift cycle.

For example, in accordance with one embodiment of the invention, a shift register is provided. The shift register comprises at least one track including a storage region. The storage region comprises a plurality of magnetic domains for storing data. A given first one of the plurality of magnetic domains is adjacent to a given second one of the plurality of magnetic domains. The given first one of the plurality of magnetic domains and the given second one of the plurality of magnetic domains are arranged in a linear configuration. Further, the given first one of the plurality of magnetic domains and the given second one of the plurality of magnetic domains are separated from one another by at least one layer of non-magnetic material, the at least one layer of non-magnetic material preventing a propagation of a nucleated wall from traveling between the given first one of the plurality of magnetic domains and the given second one of the plurality of magnetic domains. The shift register is configured such that an electric current applied to the track is operative to shift data stored within at least one of the plurality of magnetic domains of the storage region, along the track, in a direction of the electric current. The data stored within the at least one of the plurality of magnetic domains is shifted as a function of the direction of the electric current.

The at least one track may also include a reservoir region that is contiguous to the storage region, such that the data stored within the at least one of the plurality of magnetic domains of the storage region may be shifted into and out of the reservoir region as a function of the direction of the electric current. In another embodiment, a given one of the plurality of magnetic domains may include one or more portions of weak magnetic material at one or both ends of the given one of the plurality of magnetic domains. The one or more portions of weak magnetic material may encourage wall nucleation when the electric current is applied through the given one of the plurality of magnetic domains. At least one of the one or more portions of weak magnetic material may thermally react to the electric current. A magnitude of the electric current may be selectively controlled to encourage wall nucleation and/or wall propagation, within a given one of the plurality of magnetic domains. The magnitude of the electric current required for wall nucleation may be higher than the magnitude of the electric current required for wall propagation.

In accordance with a second embodiment of the present invention, a method of shifting data in a shift register is provided. An electric current is applied from at least one end of a plurality of magnetic domains comprising stored data. A given first one of the plurality of magnetic domains is adjacent to a given second one of the plurality of magnetic domains. The given first one of the plurality of magnetic domains and the given second one of the plurality of magnetic domains are arranged in a linear configuration. Further, the given first one of the plurality of magnetic domains and the given second one of the plurality of magnetic domains are separated from one another by at least one layer of non-magnetic material. The at least one layer of non-magnetic material preventing a propagation of a nucleated wall from traveling between the given first one of the plurality of magnetic domains and the given second one of the plurality of magnetic domains.

A wall may be generated within a given one of the plurality of magnetic domains. The given one of the plurality of magnetic domains may comprise one or more portions of weak magnetic material at, at least one end of the given one of the plurality of magnetic domains. The one or more portions of weak magnetic material may encourage wall nucleation when the electric current is applied through the given one of the plurality of magnetic domains. Further, the wall within the given one of the plurality of magnetic domains may be destroyed with the at least one layer of non-magnetic material.

In accordance with a third embodiment of the present invention, a shift register is presented. The shift register comprises at least one track including a storage region comprising a plurality of magnetic domains for storing data, wherein at least one portion of a given first one of the plurality of magnetic domains laterally overlaps at least one portion of a given second one of the plurality of magnetic domains, wherein the at least one portion of a given first one of the plurality of magnetic domains and the at least one portion of a given second one of the plurality of magnetic domains are separated by a gap, wherein the gap prevents a propagation of a nucleated wall from traveling between the given first one of the plurality of magnetic domains and the given second one of the plurality of magnetic domains. The shift register is configured such that an electric current applied to the track is operative to shift data stored within at least one of the plurality of magnetic domains of the storage region, along the track, in a direction of the electric current. The data stored within the at least one of the plurality of magnetic domains is shifted as a function of the direction of the electric current.

These and other objects, features, and advantages of the present invention will become apparent from the following detailed description of illustrative embodiments thereof, which is to be read in connection with the accompanying drawings.

DETAILED DESCRIPTION OF PREFERRED EMBODIMENTS

The present invention will be described in conjunction with exemplary methods and apparatus for shifting data stored in racetrack memory, or alternative shift register structure. Such methods and apparatus may be used to generate consistent and controlled magnetic domain movements along a racetrack memory track. It should be understood, however, that the invention is not limited to the particular arrangements and materials described herein. For example, the techniques described herein may be applicable to any memory storage system. Further, it should be appreciated that the exemplary racetrack memory structures shown in the accompanying figures may not be drawn to scale, and that modifications to the illustrative embodiments will become apparent to those skilled in the art given the teachings herein.

The term "electric current" as used herein is intended to be construed broadly as to encompass, by way of example and without limitation, the flow of charge. An electric current may also be referred to as a "current pulse" and/or an "electric current pulse."

The term "domain" as used herein is intended to be construed broadly so as to encompass, by way of example and without limitation, any defined unit. In one exemplary embodiment, a domain may be a defined section within a shiftable memory track wherein magnetic moments are substantially aligned in a same orientation. The direction of orientation of the magnetic moments within a given domain may be indicative of a stored data bit therein (e.g., a bit value of "0" or a bit value of "1").

The term "wall" as used herein is intended to be construed broadly so as to encompass, by way of example and without limitation, any distinct boundary within a magnetic material defining a border of a domain. The boundary may denote a transition between opposite magnetic moments in adjacent domains. In an exemplary embodiment, a wall of a domain is pushed in a direction of an applied electric current resulting in a movement of the domain along a shiftable memory track. A wall may be referred to as a "domain wall."

The term "wall nucleation" as used herein is intended to be construed broadly so as to encompass, by way of example and without limitation, any process resulting in the formation of a domain wall.

The term "wall propagation" as used herein is intended to be construed broadly so as to encompass, by way of example and without limitation, any movement of a wall across a given segment of the shiftable memory track.

The term "wall annihilation" as used herein is intended to be construed broadly so as to encompass, by way of example and without limitation, any process resulting in the destruction of a domain wall.

Figure 1:
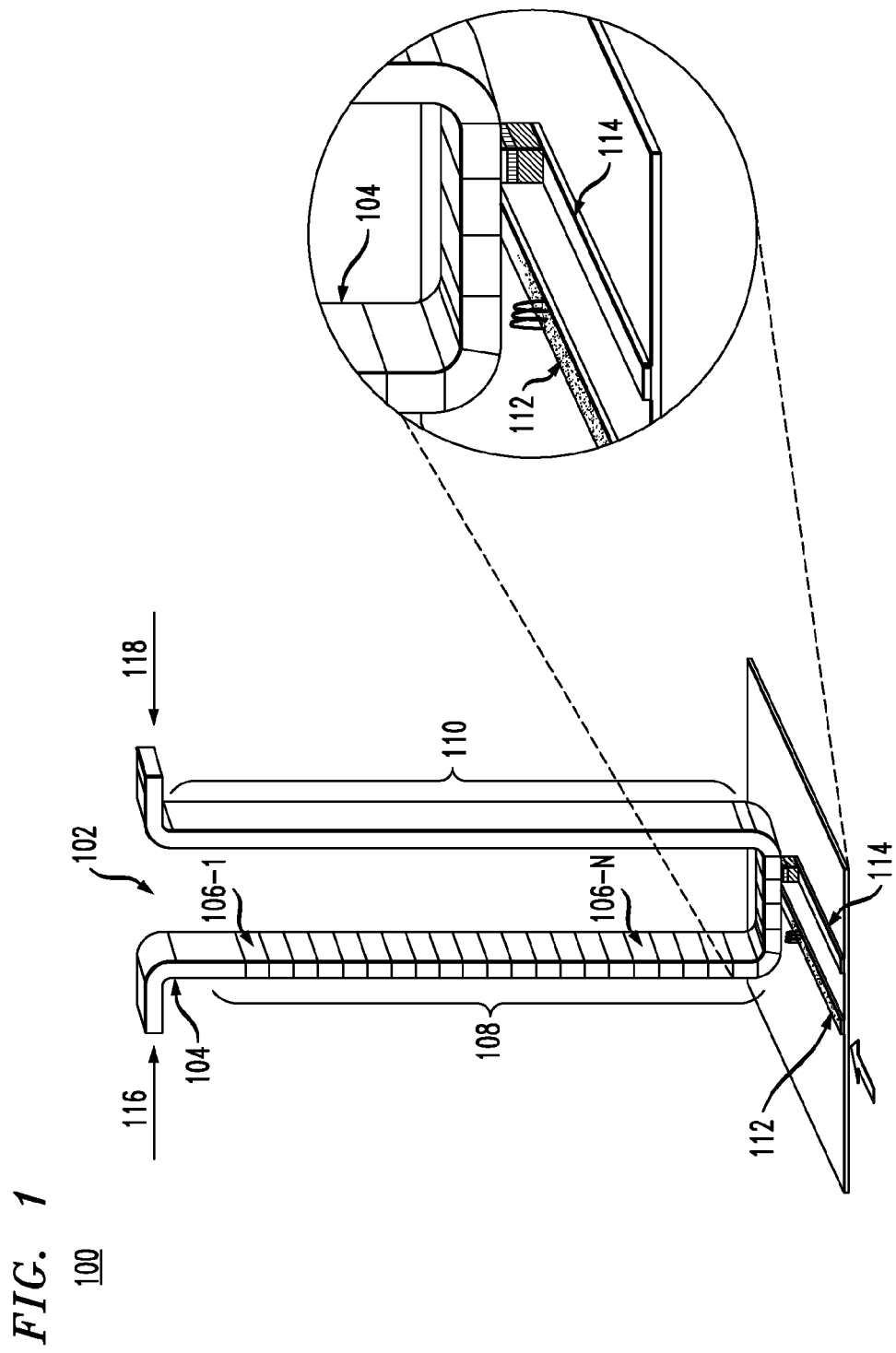
FIG. 1 is an illustrative diagram depicting an exemplary racetrack memory structure with a writing device and a reading device, in accordance with an embodiment of the present invention.

Referring now to FIG. 1, is an illustrative diagram depicting an exemplary racetrack memory structure 100 with a writing device 112 and a reading device 114, in accordance with an embodiment of the present invention. Conventional racetrack memory designs are known to a person having ordinary skill in the art. See, e.g., U.S. Pat. No. 6,834,005, issued Dec. 21, 2004, entitled, "Shiftable Magnetic Shift Register and Method of Using the Same," the disclosure of which is incorporated herein by reference. In racetrack memory structure 100, a shift register 102 comprises a fine track 104 made of magnetic material. Adjacent domains 106-1, . . . , 106-N, within the track 104 may be separately magnetized in one direction or in the opposite direction, wherein the direction of magnetism of a given domain (e.g., 106-1, . . . , 106-N) determines the data stored within the given domain (e.g., bit value of "0" or "1"). The variation in the direction of the magnetic moments stored within a plurality of domains forms the basis for storing information in the track 104.

In an exemplary embodiment, the track 104 comprises a storage region 108 and a reservoir region 110. The storage region 108 comprises one or more domains 106-1, . . . , 106-N comprising stored magnetic moments, each of the one or more domains 106-1, . . . , 106-N representing stored data, for example, "0" or "1" binary data. Further, the track 104 is designed to comprise additional length in the form of a reservoir 110. The reservoir region 110 is made sufficiently long so as to accommodate a movement of the domains 106-1, . . . , 106-N along the track 104 across reading device 114 and/or writing device 112 positioned at one or more fixed points along the track 104.

In order to move the domains, an electric current 116 is applied to the track 104, which causes a shifting of the domains 106-1, . . . , 106-N along the track 104 in a direction of the electric current 116. It should be appreciated that an electric current applied to the track 104 in the opposite direction 118 will cause the domains 106-1, . . . , 106-N to move in the opposite direction. This mechanism allows the domains 106-1, . . . , 106-N to move back and forth through the track 104. As a result, during operation, at least a portion of the domains 106-1, . . . , 106-N may reside in the storage region 108 while the remaining domains may reside in the reservoir region 110, or vice versa. In one embodiment, the reservoir region 110 is devoid of domains 106-1, . . . , 106-N during a quiescent state.

As an electric current (e.g., electric current 116 or 118) passes from one domain to an adjacent domain, the boundary between the domains, i.e., domain wall, moves in a direction of the flowing current. This occurs because when an electric current passes through a domain, it becomes "spin polarized." When the spin polarized current passes into an adjacent domain, across the dividing domain wall, it applies a spin torque to the wall and the adjacent domains. This spin torque moves the domain wall. Domain wall velocities can be very high, for example, in the order of 100 m/sec.

The precise movement of the domains 106-1, . . . , 106-N may be difficult to control. For example, if the applied current (e.g., electric current 116 or 118) is too weak or too strong, the movement of the domains 106-1, . . . , 106-N along the track 104 may be inconsistent so as prevent a reliable shifting of the domains for reading and writing purposes. Further, even if no current is applied, the domains 106-1, . . . , 106-N may spontaneously shift due to environmental conditions (e.g., stray magnetic fields, temperature, etc.).

In an effort to regulate shifting of the domains 106-1, . . . , 106-N and to prevent spontaneous movement of the domains 106-1, . . . , 106-N during a "resting state," the present invention proposes to: (1) generate and propagate domain walls when the shift register 102 is in use; and (2) eliminate the domain walls when the shift register 102 is in an idle state.

In one illustrative embodiment, the track 104 of adjacent magnetic domains 106-1, . . . , 106-N are separated by one or more layers of non-magnetic material. Separating adjacent domains with non-magnetic material prevents the propagation of a domain wall beyond the length of a given domain; the non-magnetic material destroys a propagating domain wall. It should be noted that the propagation of a domain wall causes a domain shift. Further, the destruction of a domain wall prevents an additional domain shift from occurring. Therefore, by regulating domain wall formation and destruction, a domain shift may be controlled. Under the proposed design, one pulse of electric current results in the generation, propagation, and destruction of a domain wall. As a result, one pulse of electric current yields one consistent domain shift. However, it should be appreciated that generation, propagation, and destruction of a domain wall will not occur if adjacent domains have substantially the same magnetic moment orientation.

Figure 2:
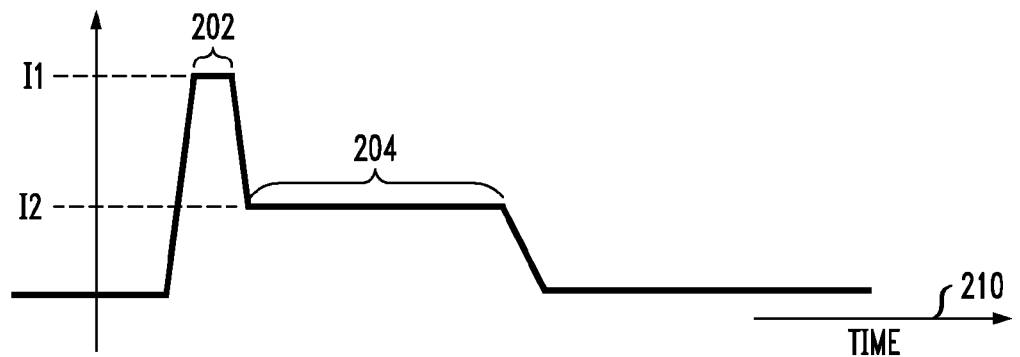
FIG. 2 is an illustrative diagram depicting an exemplary current profile for a process of wall nucleation and wall propagation, in accordance with an embodiment of the present invention.

Referring now to FIG. 2, an illustrative diagram depicts an exemplary current profile for a process of wall nucleation and wall propagation over time 210, in accordance with an embodiment of the present invention. As described above, two adjacent segments of magnetic material are separated by one or more layers of non-magnetic material. In accordance with an exemplary embodiment, a domain wall is generated (e.g., nucleated) any time an applied electric current travels through a boundary of opposing magnetic moments. The nucleated wall then propagates with the electric current through a given segment of adjacent magnetic material. When the nucleated wall comes in contact with the one or more layers of non-magnetic material, the wall is annihilated. This process of wall nucleation, wall propagation, and wall annihilation corresponds to one shift cycle.

FIG. 2 illustrates the relative current needed for wall nucleation 202 and wall propagation 204. The relative current needed for wall nucleation 202 is preferably greater than the current needed for wall propagation 204. The difference in the minimum current needed for nucleation 202 and propagation 204 may be used to control domain shifting. For example, an initial current pulse at a first magnitude, I1, with enough magnitude to encourage wall nucleation 202 may be applied to a given domain for a prescribed period of time. The magnitude of the current pulse may then be reduced to a second level, I2, which sustains wall propagation 204 but prevents additional wall nucleation. It should be noted that if additional walls are nucleated, additional domain shifts will occur.

It should also be noted that the duration of current needed for wall nucleation 202 may be shorter than the duration of current needed for propagation 204 of a wall across a segment of magnetic material. Further, as a nucleated wall propagates across a segment of magnetic material, the edges of the nucleated wall have substantially the same magnetization on both sides; therefore, a new wall is not generated until the wall propagation and wall annihilation processes are complete. Furthermore, the current used for propagation may be lower than the current needed for wall nucleation. As a result, no new walls are nucleated after wall propagation and wall annihilation unless the current is raised. Unlike the present invention, conventional techniques cannot benefit from wall nucleation and wall propagation because new domain walls are not generated at every shift cycle. Rather, in conventional designs the domain walls remain present between shift cycles, thereby creating a likelihood for an erroneous shift to occur.

Figure 3:
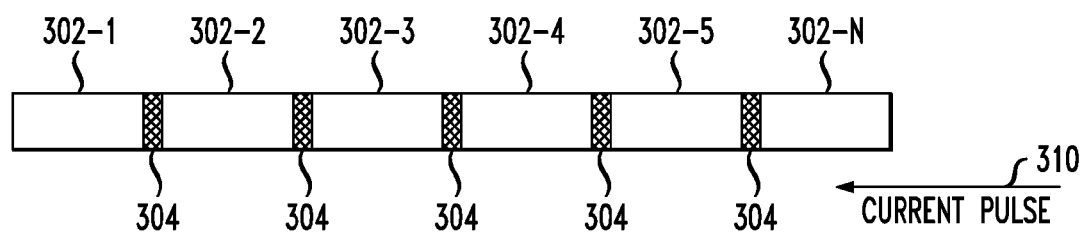
FIG. 3 is an illustrative diagram depicting at least a portion of the exemplary racetrack memory structure of FIG. 1, including a plurality of magnetic domains separated by non-magnetic material, in accordance with an embodiment of the present invention.

Referring now to FIG. 3, an illustrative diagram depicts at least a portion of the exemplary racetrack memory structure of FIG. 1, including a plurality of magnetic domains, 302-1, . . . , 302-N, separated by non-magnetic material 304, in accordance with an embodiment of the present invention. It is to be appreciated that the non-magnetic material 304 may be one or more thin layers of non-magnetic material. In an exemplary embodiment, an electric current pulse 310 is applied through a track of adjacent magnetic domains 302-1, . . . , 302-N separated by non-magnetic material 304. As the electric current passes through two adjacent segments of magnetic material comprising opposing magnetic moments, the current may change spin polarization. This results in the nucleation of a domain wall. For example, if domains 302-2 and 302-3 comprise opposing magnetic moments, an electric current passing through domain 302-2 to domain 302-3 will cause a domain wall to nucleate at the leading edge of domain 302-3. The domain wall then propagates with the current pulse 310 across the segment of magnetic material defined as domain 302-3. When the domain wall reaches the non-magnetic material 304 between domains 302-3 and 302-4, the domain wall is annihilated. Therefore, one electric pulse will result in a cycle of wall nucleation, wall propagation, and wall annihilation. After a nucleated wall is annihilated a domain can no longer shift. This technique ensures that one pulse of current will only result in one domain shift.

It should be noted that in the example above, the initial current of the electric current pulsed through the track of domains is enough to promote wall nucleation within the domains. The current is then reduced to a level which sustains wall propagation, but prevents additional shift cycles from occurring, as stated above in conjunction with FIG. 2. If the electric current pulse 310 is not reduced, then the duration of the pulse may be carefully controlled to avoid repeating the cycle of nucleation, propagation, and annihilation, which results in additional shifts.

Figure 4:
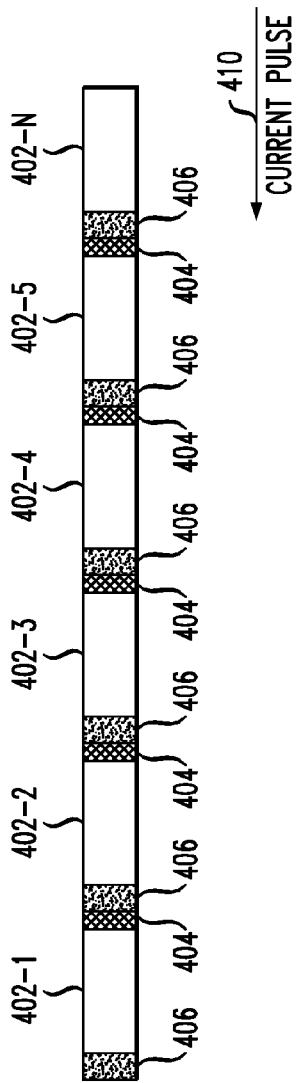
FIG. 4 is an illustrative diagram depicting at least a portion of the exemplary racetrack memory structure of FIG. 1, including a plurality of magnetic domains separated by non-magnetic material, each of the plurality of magnetic domains comprising weak magnetic material at one end, in accordance with an embodiment of the present invention.

Referring now to FIG. 4, an illustrative diagram depicts at least a portion of the exemplary racetrack memory structure of FIG. 1, including a plurality of magnetic domains, 402-1, . . . , 402-N, separated by non-magnetic material 404, each of the plurality of magnetic domains 402-1, . . . , 402-N comprising weak magnetic material 406 at one end, in accordance with an embodiment of the present invention. The plurality of magnetic domains 402-1, . . . , 402-N separated by non-magnetic material 404 operate similarly to the magnetic domains of FIG. 3. An applied electric current pulse 410 will result in wall nucleation, wall propagation, and wall annihilation within each of the plurality of magnetic domains 402-1, . . . , 402-N, as similarly described above with reference to FIG. 3. However, in an exemplary embodiment, each of the plurality of magnetic domains 402-1, . . . , 402-N may comprise a portion of comparatively weak magnetic material 406. Magnetic material 406 may be defined as "weak" because it possesses a weaker magnetic moment in comparison to the magnetic material of the magnetic domains (e.g., 402-1, . . . , 402-N). Weak magnetic material 406 may be constructed, for example, by taking the magnetic material used to produce a given magnetic domain (e.g., 402-1, . . . , 402-N) and reducing the coupling between the magnetic grains. A magnetic medium with low magnetic moment may be more reactive to electric currents. As a result, the weak magnetic material 406 may be used to facilitate wall nucleation in one current direction (i.e., unidirectional). In this embodiment, wall nucleation is encouraged at the leftmost portion of each magnetic domain (e.g., 402-1, . . . , 402-N) by a portion of weak magnetic material 406. Wall propagation then occurs from left to right, causing the magnetic domains (e.g., 402-1, . . . , 402-N) to shifted from left to right. It should be appreciated that because the data flow is unidirectional in this embodiment, this arrangement may be referred to as a destructive read-out.

In an additional embodiment, the weak magnetic material 406 may also comprise material that thermally reacts to the electric current 410. For example, a portion of weak magnetic material 406 may be constructed to heat up as current 410 travels through it. An increase in temperature of the weak magnetic material 406 may further encourage wall nucleation.

In one embodiment, the weak magnetic material 406 is situated at the leading edge of a given magnetic domain (e.g., 402-1, . . . , 402-N). In the example of FIG. 4, an electric current pulse 410 is applied across the plurality of magnetic domains 402-1, . . . , 402-N, from left to right. As the electric current pulse 410 travels from a magnetic domain (e.g., 402-1) to an adjacent magnetic domain (e.g., 402-2), the current first comes in contact with weak magnetic material 406. The weak magnetic moment of weak magnetic material 406 promotes the formation of a domain wall (e.g., wall nucleation). After a wall is nucleated, the wall travels across the segment of magnetic material defined as domain 402-2 until it is annihilated at non-magnetic material 404.

Figure 5:
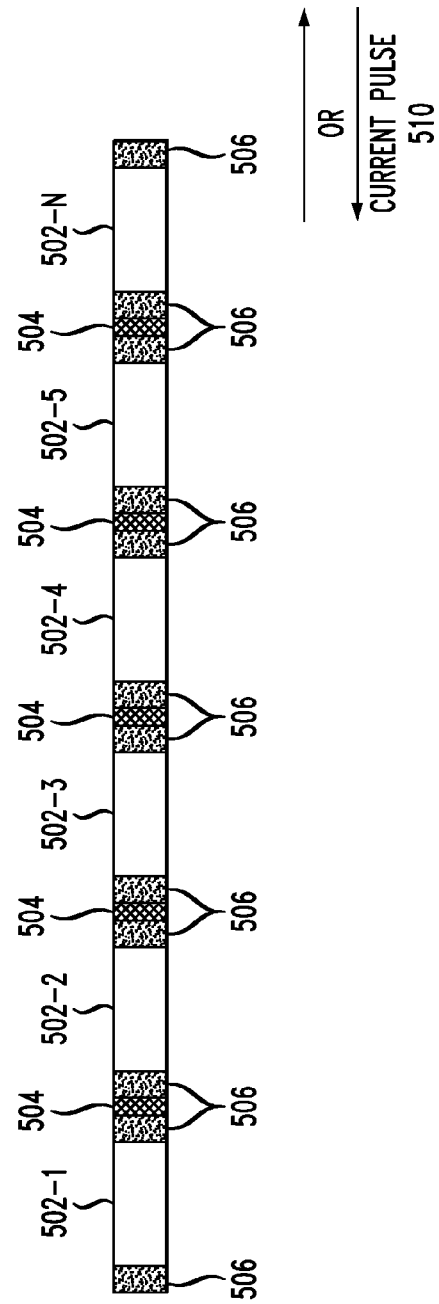
FIG. 5 is an illustrative diagram depicting at least a portion of the exemplary racetrack memory structure of FIG. 1, including a plurality of magnetic domains separated by non-magnetic material, each of the plurality of magnetic domains comprising weak magnetic material at both ends, in accordance with an embodiment of the present invention.

Referring now to FIG. 5, an illustrative diagram depicts at least a portion of the exemplary racetrack memory structure of FIG. 1, including a plurality of magnetic domains, 502-1, . . . , 502-N, separated by non-magnetic material 504, each of the plurality of magnetic domains 502-1, . . . , 502-N comprising weak magnetic material 506 at both ends of a given domain, in accordance with an embodiment of the present invention. The plurality of magnetic domains 502-1, . . . , 502-N operate in a similar manner as described with reference to FIG. 3. A current pulse 510 will result in wall nucleation, wall propagation, and wall annihilation within a given magnetic domain (e.g., 502-1, . . . , 502-N). Further, as described with reference to FIG. 4, each of the plurality of magnetic domains 502-1, . . . , 502-N may comprise a portion of comparatively weak magnetic material 506. However, unlike FIG. 4, FIG. 5 illustrates a portion of weak magnetic material 506 at both ends of each of the plurality of magnetic domains 502-1, . . . , 502-N. By situating a portion of weak magnetic material 506 at both ends of a given magnetic domain, wall nucleation is promoted in both directions of current (i.e., bidirectional). For example, current pulse 510 may travel from left to right or right to left. In either scenario, the weak magnetic material 506 encourages wall nucleation. The nucleated wall then propagates across a given segment of magnetic material and is annihilated by a portion of non-magnetic material 504, which separates the given segment of magnetic material from an adjacent segment of magnetic material.

Figure 6A:
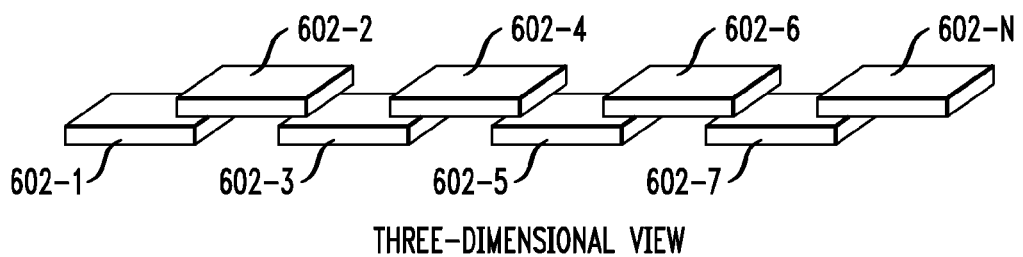
FIGS. 6A-B illustrate a three-dimensional diagram and a cross-sectional diagram, respectively, depicting at least a portion of the exemplary racetrack memory structure of FIG. 1, including a plurality of partially overlapping segments of magnetic material separated by small gaps, in accordance with an embodiment of the present invention.
Figure 6B:
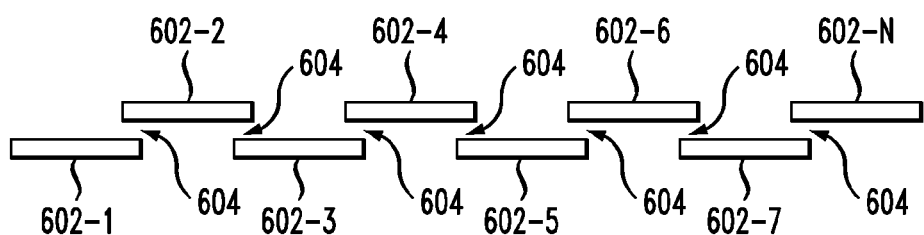

Referring now to FIGS. 6A-B, a three-dimensional diagram and a cross-sectional diagram, respectively, depicts at least a portion of the exemplary racetrack memory structure of FIG. 1, including a plurality of partially overlapping segments of magnetic material, 602-1, . . . , 602-N, separated by small gaps 604, in accordance with an embodiment of the present invention. In contrast to the illustrative embodiments of FIGS. 3-5, FIGS. 6A-B depict an alternative to separating a track of magnetic domains with non-magnetic material. In FIGS. 6A-B, a set of magnetic segments (e.g., 602-1, 602-3, 602-5, and 602-7) are deposited onto a surface (e.g., a semiconductor wafer). Next, a layer of dielectric material, or an alternative insulating material (e.g., silicon dioxide or silicon nitride), is deposited over the set of magnetic segments (e.g., 602-1, 602-3, 602-5, and 602-7). An additional set of magnetic material segments (e.g., 602-2, 602-4, and 602-6, etc.) are then deposited on top of the layer of dielectric material in a pattern which overlaps the first set of magnetic segments (e.g., 602-1, 602-3, 602-5, and 602-7). In effect, the gaps 604 of dielectric material separate the plurality of magnetic segments 602-1, . . . , 602-N. The gaps 604 operate in a similar manner to the non-magnetic materials of FIGS. 3-5.

In one illustrative embodiment, a current pulse 610, traveling across the plurality of magnetic segments 602-1, . . . , 602-N from left to right, may result in the following reaction. If magnetic segments 602-1 and 602-2 comprise opposing magnetic moments, the current pulse 610, will cause a domain wall to nucleate at the leading edge (e.g., leftmost portion) of segment 602-2. The nucleated wall then propagates with the current 610 across magnetic segment 602-2. When the nucleated wall reaches gap 604, which separates magnetic segment 602-2 from magnetic segment 602-3, the nucleated wall is annihilated. Similar to FIGS. 3-5, one cycle of wall nucleation, wall propagation, and wall annihilation results in one controlled domain shift.

It should be noted that gaps 604 are preferably thin enough to allow current pulse 610 to travel across the plurality of magnetic segments 602-1, . . . , 602-N from left to right or right to left. Furthermore, although not explicitly shown, it should be appreciated that the techniques of placing weak magnetic material at one or both ends of each of the plurality of magnetic segments 602-1, . . . , 602-N, as described with reference to FIGS. 4 and 5, may also be applied to the embodiment of FIGS. 6A-B to encourage wall nucleation at each magnetic segment in one or both directions. The weak magnetic material may also be thermally reactive, as described above with reference to FIG. 4.

Although illustrative embodiments of the present invention have been described herein with reference to the accompanying figures, it is to be understood that the invention is not limited to those precise embodiments, and that various other changes and modifications may be made therein by one skilled in the art without departing from the scope of the claims.

What is claimed is:

1. A shift register, comprising:
   at least one track including:
      a storage region comprising a plurality of magnetic domains for storing data, wherein a given first one of the plurality of magnetic domains is adjacent to a given second one of the plurality of magnetic domains, the given first one of the plurality of magnetic domains and the given second one of the plurality of magnetic domains being arranged in a linear configuration, further wherein the given first one of the plurality of magnetic domains and the given second one of the plurality of magnetic domains are separated from one another by at least one layer of non-magnetic material, the at least one layer of non-magnetic material preventing a propagation of a nucleated wall from traveling between the given first one of the plurality of magnetic domains and the given second one of the plurality of magnetic domains,
   wherein the shift register is configured such that an electric current applied to the track is operative to shift data stored within at least one of the plurality of magnetic domains of the storage region, along the track, in a direction of the electric current, further wherein the data stored within the at least one of the plurality of magnetic domains is shifted as a function of the direction of the electric current.

2. The shift register of claim 1, wherein the at least one track further includes a reservoir region that is contiguous to the storage region, such that the data stored within the at least one of the plurality of magnetic domains of the storage region is shifted into and out of the reservoir region as a function of the direction of the electric current.

3. The shift register of claim 1, wherein a given one of the plurality of magnetic domains comprises one or more portions of weak magnetic material at, at least one end of the given one of the plurality of magnetic domains, wherein the one or more portions of weak magnetic material encourages wall nucleation when the electric current is applied through the given one of the plurality of magnetic domains.

4. The shift register of claim 3, wherein at least one of the one or more portions of weak magnetic material thermally reacts to the electric current.

5. The shift register of claim 1, wherein a magnitude of the electric current is selectively controlled to encourage at least one of a wall nucleation and a wall propagation, within a given one of the plurality of magnetic domains, such that the magnitude of the electric current required for wall nucleation is higher than the magnitude of the electric current required for wall propagation.

6. A method of shifting data in a shift register, the method comprising the step of:
   applying an electric current from at least one end of a plurality of magnetic domains comprising stored data, wherein a given first one of the plurality of magnetic domains is adjacent to a given second one of the plurality of magnetic domains, the given first one of the plurality of magnetic domains and the given second one of the plurality of magnetic domains being arranged in a linear configuration, further wherein the given first one of the plurality of magnetic domains and the given second one of the plurality of magnetic domains are separated from one another by at least one layer of non-magnetic material, the at least one layer of non-magnetic material preventing a propagation of a nucleated wall from traveling between the given first one of the plurality of magnetic domains and the given second one of the plurality of magnetic domains.

7. The method of claim 6, further comprising the step of generating a wall within a given one of the plurality of magnetic domains, wherein the given one of the plurality of magnetic domains comprises one or more portions of weak magnetic material at, at least one end of the given one of the plurality of magnetic domains, wherein the one or more portions of weak magnetic material encourages wall nucleation when the electric current is applied through the given one of the plurality of magnetic domains.

8. The method of claim 7, further comprising the step of heating the one or more portions of weak magnetic material using the electric current, wherein at least one of the one or more portions of weak magnetic material thermally react to the electric current.

9. The method of claim 7, further comprising the step of destroying the wall within the given one of the plurality of magnetic domains with the at least one layer of non-magnetic material.

10. The method of claim 6, further comprising the step of selectively controlling a magnitude of the electric current to encourage at least one of a wall nucleation and a wall propagation, within a given one of the plurality of magnetic domains, such that the magnitude of the electric current required for wall nucleation is higher than the magnitude of the electric current required for wall propagation.

11. A shift register, comprising:
   at least one track including:
      a storage region comprising a plurality of magnetic domains for storing data, wherein at least one portion of a given first one of the plurality of magnetic domains laterally overlaps at least one portion of a given second one of the plurality of magnetic domains, wherein the at least one portion of a given first one of the plurality of magnetic domains and the at least one portion of a given second one of the plurality of magnetic domains are separated by a gap, wherein the gap prevents a propagation of a nucleated wall from traveling between the given first one of the plurality of magnetic domains and the given second one of the plurality of magnetic domains, wherein the shift register is configured such that an electric current applied to the track is operative to shift data stored within at least one of the plurality of magnetic domains of the storage region, along the track, in a direction of the electric current, further wherein the data stored within the at least one of the plurality of magnetic domains is shifted as a function of the direction of the electric current.

12. The shift register of claim 11, wherein the at least one track further includes a reservoir region that is contiguous to the storage region, such that the data stored within the at least one of the plurality of magnetic domains of the storage region is shifted into and out of the reservoir region as a function of the direction of the electric current.

13. The shift register of claim 11, wherein a given one of the plurality of magnetic domains comprises one or more portions of weak magnetic material at, at least one end of the given one of the plurality of magnetic domains, wherein the one or more portions of weak magnetic material encourages wall nucleation when the electric current is applied through the given one of the plurality of magnetic domains.

14. The shift register of claim 13, wherein at least one of the one or more portions of weak magnetic material thermally reacts to the electric current.

15. The shift register of claim 11, wherein a magnitude of the electric current is selectively controlled to encourage at least one of a wall nucleation and a wall propagation, within a given one of the plurality of magnetic domains, such that the magnitude of the electric current required for wall nucleation is higher than the magnitude of the electric current required for wall propagation.

* * * * *